(12) United States Patent
Yen

(10) Patent No.: US 7,780,803 B2
(45) Date of Patent: Aug. 24, 2010

(54) APPARATUS AND METHOD FOR POSITIONING AND ASSEMBLING CIRCUIT BOARD

(76) Inventor: Chen-Hsiang Yen, No. 97, Cingtian St., Taoyuan City, Tao Yuan Hsien (TW)

(*) Notice: Subject to any disclaimer, the term of this patent is extended or adjusted under 35 U.S.C. 154(b) by 714 days.

(21) Appl. No.: 11/790,099

(22) Filed: Apr. 23, 2007

(65) Prior Publication Data
US 2008/0060753 A1    Mar. 13, 2008

(51) Int. Cl.
*B32B 41/00* (2006.01)

(52) U.S. Cl. .............................. 156/64; 700/254; 29/837

(58) Field of Classification Search ................... 156/64, 156/351, 358, 362, 378, 379; 700/254; 29/832, 29/833, 835, 836, 837, 838, 839, 840, 841
See application file for complete search history.

(56) References Cited

U.S. PATENT DOCUMENTS 6,811,627 B2 * 11/2004 Arai et al. ..................... 156/64

2004/0163242 A1 * 8/2004 Fukunaga ..................... 29/833

* cited by examiner

*Primary Examiner*—George R Koch, III
(74) *Attorney, Agent, or Firm*—Alan Kamrath; Kamrath & Associates PA

(57) ABSTRACT

An apparatus for positioning and assembling of a circuit board includes a vacuum adsorption mechanism, an adjusting mechanism, at least four cameras, and a controller. The vacuum adsorption mechanism has a vacuum adsorption platform on which several holes are formed. The vacuum adsorption platform is connected to several vacuum, generators to control the adsorption and positioning of the main board of the circuit board. The vacuum adsorption platform has a through hole. The adjusting mechanism is mounted corresponding to the through hole. The adjusting mechanism is designed to enable the adsorbed daughter board to be adjustable in three axial directions. Two cameras are located corresponding to the main board. The other two cameras are located corresponding to the daughter board for detecting the optical points of the main board and the measuring points of the daughter board. The controller is electrically connected to these cameras.

8 Claims, 5 Drawing Sheets

APPARATUS AND METHOD FOR POSITIONING AND ASSEMBLING CIRCUIT BOARD

FIELD OF THE INVENTION

The present invention relates to an apparatus for positioning and assembling a circuit board and a method of operation thereof and, more particularly, to an apparatus that comprises a vacuum adsorption mechanism, an adjusting mechanism, at least four cameras, and a controller for detecting optical points of a main board and measuring points of a daughter board so as to complete the positioning and assembling operation. Accordingly, the present invention achieves the purposes of providing convenient, easy operation and convenient positioning and is thus suitable for replacing and repairing the daughter board on the main board of the circuit board.

BACKGROUND OF THE INVENTION

With progressive developments of communication, computer, networks, and so on, all kinds of information can be obtained easily by the use of computers and all kinds of electronic instruments. However, the circuit boards are inevitably applied to these computer and electronic instruments, and several circuit boards are embedded in the common-seen circuit panel. If it is detected that some circuit boards embedded in the common-seen circuit panel are defective, the circuit panel must be discarded, causing the waste of the good circuit boards. In addition, a new circuit panel must be produced to replace the discarded circuit panel and achieving the target amount of the circuit panel. For purposes of saving time and cost spent on the reproduction of the circuit panel, many related patents are disclosed. For example, as disclosed in Taiwan Patent No. I228,020, entitled "a method for replacing defective multi-linked printed circuit board", the method for replacing the defective multi-linked printed circuit board comprises:

a. forming a base moldboard by using several positioning holes formed on a multi-linked printed circuit board and forming several pins according to the positioning holes, wherein the pins are fixed on the moldboard to serve as bases;

b. positioning a defective multi-linked printed circuit board on the moldboard according to the pins, wherein a single piece of defective printed circuit board of the multi-linked printed circuit board is cut off;

c. inserting a single piece of good printed circuit board obtained by cutting another multi-linked printed circuit board into the unoccupied space of the defective multi-linked printed circuit board correctly by using the pins formed on the moldboard;

d. injecting a layer of glue into the gaps between the good printed circuit board and the defective multi-linked printed circuit board for assembling them to each other; and e. curing the defective multi-linked printed circuit board in an optimum temperature-controlled environment.

As described above, a base moldboard is formed by using several positioning holes on a multi-linked printed circuit board, and several pins are formed according to the positioning holes. The pins are fixed on the moldboard to serve as bases. In addition, a defective multi-linked printed circuit board can be positioned on the moldboard according to the pins. A single piece of defective printed circuit board of the multi-linked printed circuit board is cut off. Besides, a single piece of good printed circuit board obtained by cutting other multi-linked printed circuit board is inserted into the unoccupied space of the defective multi-linked printed circuit board.

As a result, this conventional replacing method is very complicated and inconvenient, since the use of the moldboard and the pins is unavoidable. In addition, different moldboard and pins must be provided if a different type of circuit board is utilized. Accordingly, the production cost and the required time are thus increased. Therefore, this conventional replacing method does not satisfy the practical requirement.

SUMMARY OF THE INVENTION

A main object of the present invention is to provide an apparatus for positioning and assembling the circuit board and a method of operation thereof. The apparatus comprises a vacuum adsorption mechanism, an adjusting mechanism, at least four cameras, and a controller for detecting optical points of the main board and measuring points of the daughter board so as to complete the positioning and assembling operation. Accordingly, the present invention achieves the purposes of providing convenient, easy operation and convenient positioning so as to increase practicability and convenience.

In order to achieve the above-mentioned object, a method for positioning and assembling a circuit board comprises:

(a) capturing coordinate values of optical points of a main board and measuring points of a daughter board from a CAD/CAM diagram;

(b) fixing at least two cameras exactly above said optical points of said main board by adjustment according to said optical points of said main board of a practical circuit board;

(c) fixing at least two cameras exactly above said measuring points by adjustment according to said measuring points of said daughter board of said practical circuit board;

(d) calibrating said CAD/CAM diagram to obtain error values between said coordinate values of said optical points of said main board and said measuring points of said daughter board and said practical circuit board so as to obtain practical error values;

(e) inputting said error values into a controller for calculation;

(f) inputting parameters and coordinate values required for adjustment;

(g) adjusting said measuring points of said daughter board and said optical points of said main board that has defective pieces to obtain said required coordinate values and fixing said daughter board and said main board on said controller;

(h) fixing front surfaces of said daughter board and said main board of said circuit board by an adhesive tape for completing the positioning operation after their measurements are completed;

(i) spreading a layer of glue on backside junctions of said daughter board and said main board of said circuit board;

(j) baking and curing said daughter board and said main board of said circuit board that have said glue layer formed thereon; and (k) tearing off said adhesive tape disposed on said front surfaces of said daughter board and said main board of said circuit board so as to complete the positioning and assembling operation.

An apparatus for positioning and assembling a circuit board comprises:

a vacuum adsorption mechanism, said vacuum adsorption mechanism having a vacuum adsorption platform on which a plurality of holes are formed, said vacuum adsorption platform being connected to a plurality of vacuum generators so as to control the adsorption and positioning of a main board of said circuit board, and said vacuum adsorption platform having a through hole formed thereon;

an adjusting mechanism, said adjusting mechanism being mounted on a position corresponding to said through hole of said vacuum adsorption platform, said adjusting mechanism having a three-axis adjusting module and an adsorption platform so as to enable an adsorbed daughter board of said circuit board to be adjustable in three axial directions;

at least four cameras, two of said at least four cameras being located in positions corresponding to said main board of said circuit board, and the other two of said at least four cameras being located in positions corresponding to said daughter board of said circuit board for detecting said optical points of said main board and said measuring points of said daughter board; and a controller, said controller being electrically connected to said at least four cameras for the purposes of detection, comparison, and positioning.

Other objects and features of the present invention will become apparent from the following detailed description when taken in conjunction with the drawings in which:

DETAILED DESCRIPTION OF THE PREFERRED EMBODIMENT

Figure 1:
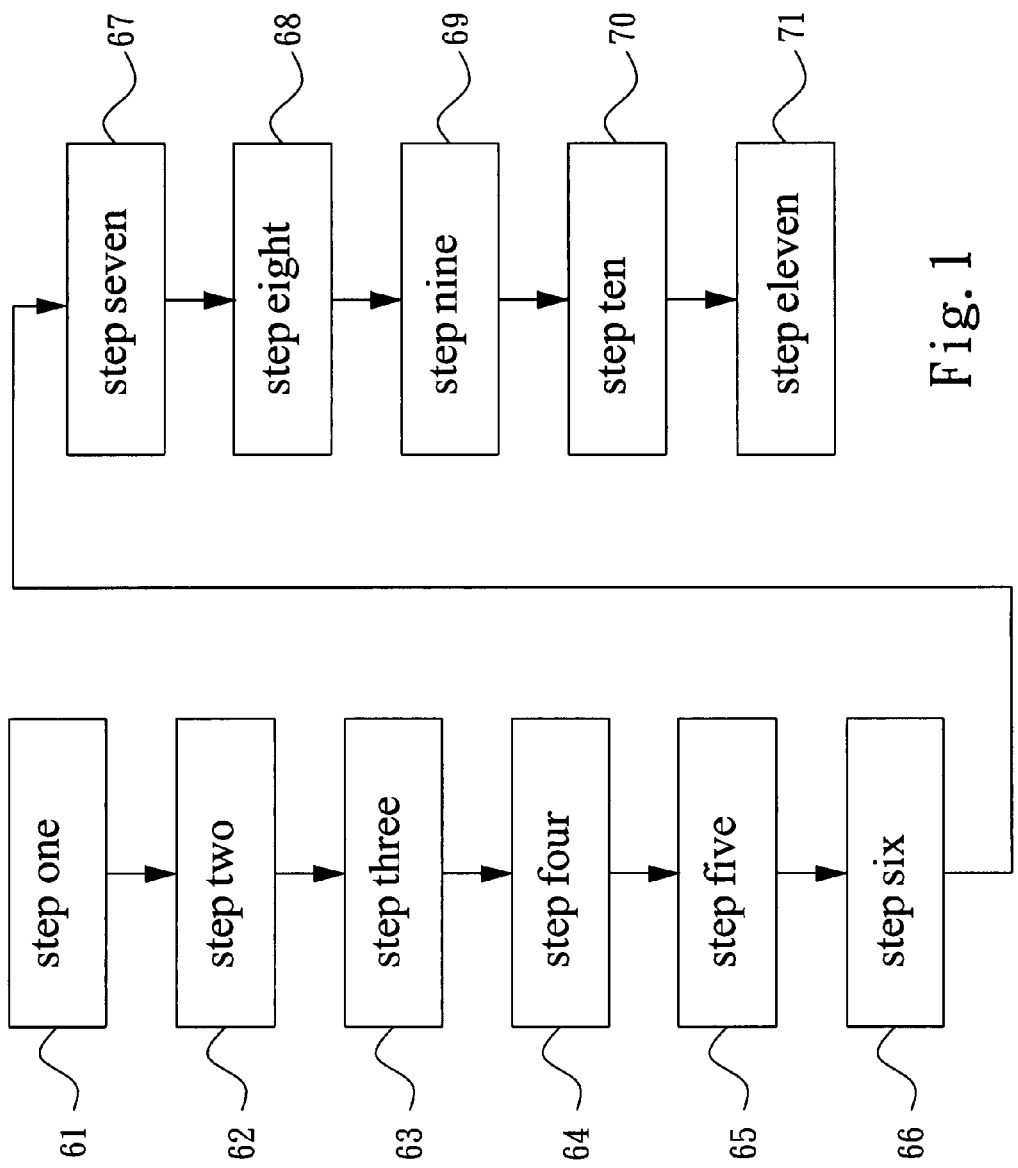
FIG. 1 is a schematic showing the operation steps of the present invention.
Figure 2:
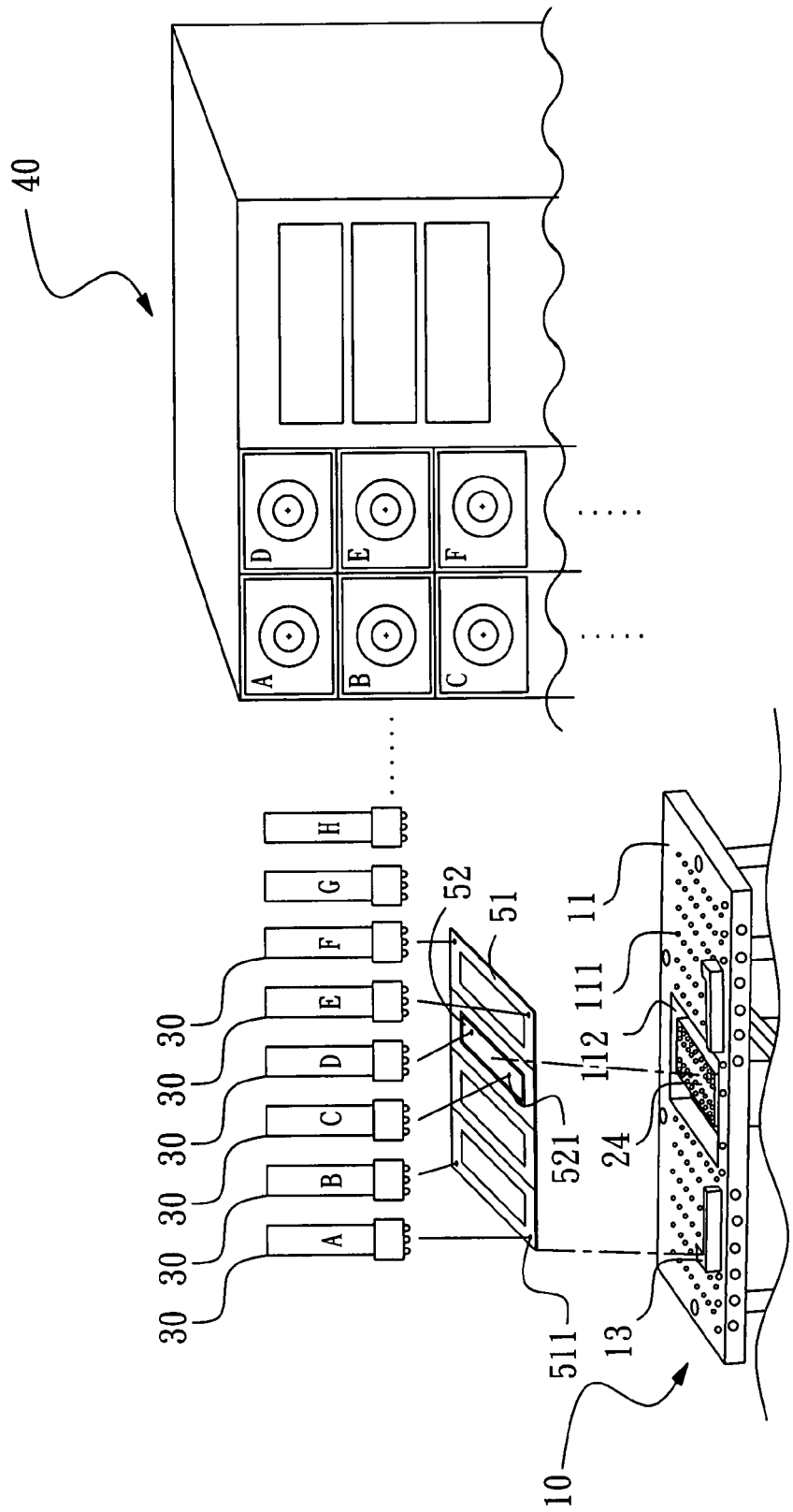
FIG. 2 is a schematic showing the operation status of the present invention.
Figure 3:
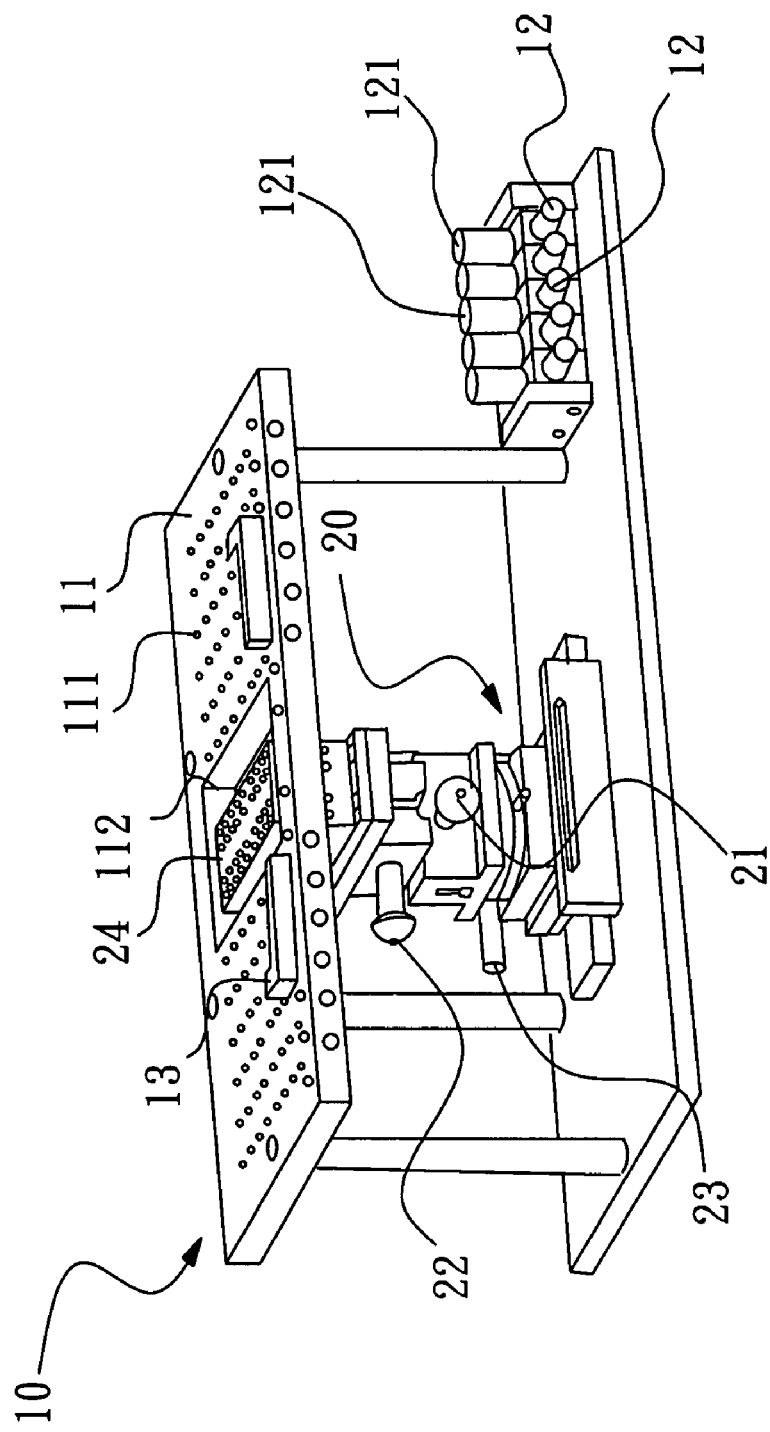
FIG. 3 is an elevational view showing the vacuum adsorption mechanism and the adjusting mechanism of the present invention.
Figure 4:
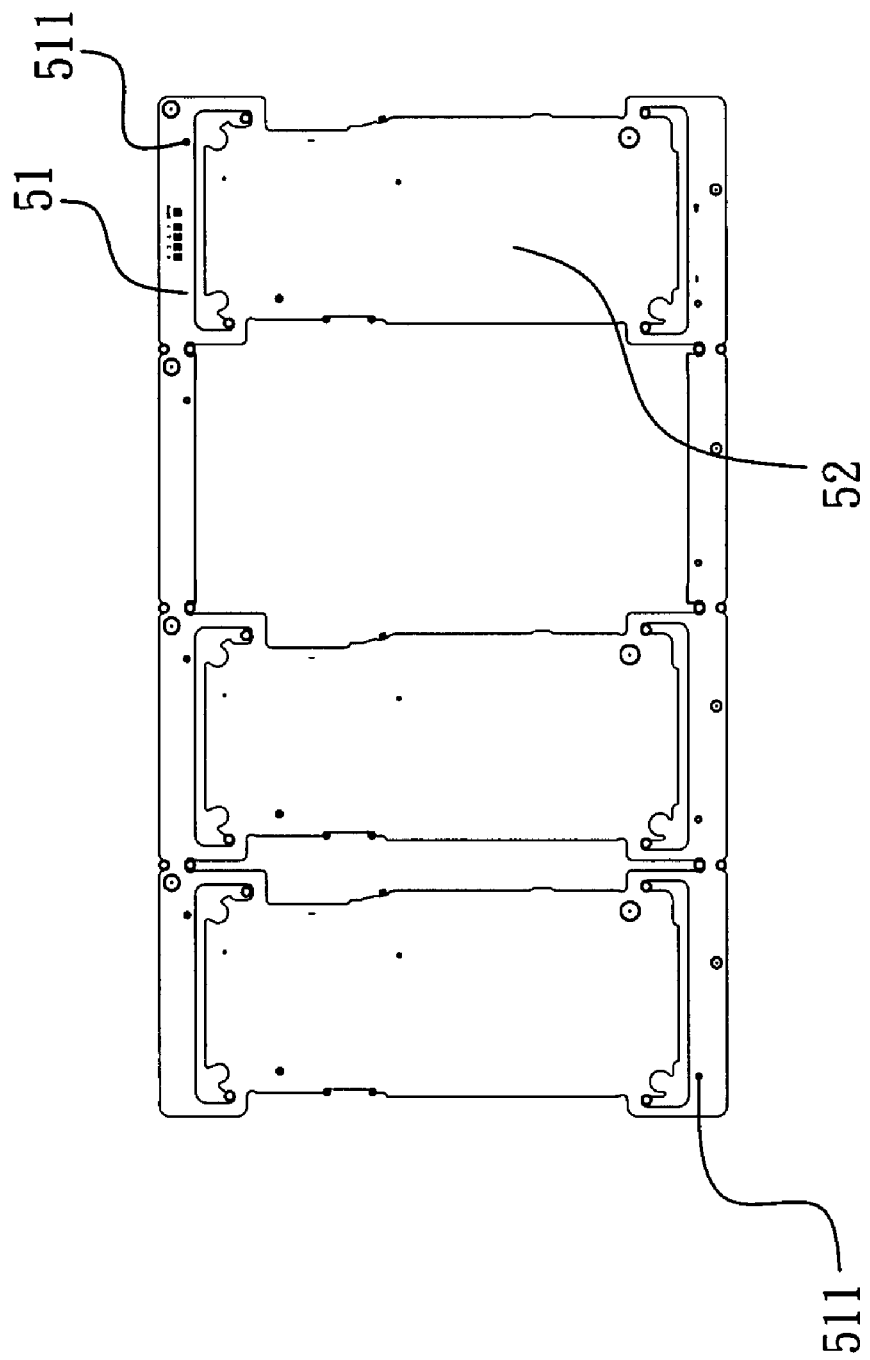
FIG. 4 is a schematic planar view showing the main board of the circuit board that has defective pieces in accordance with the present invention.
Figure 5:
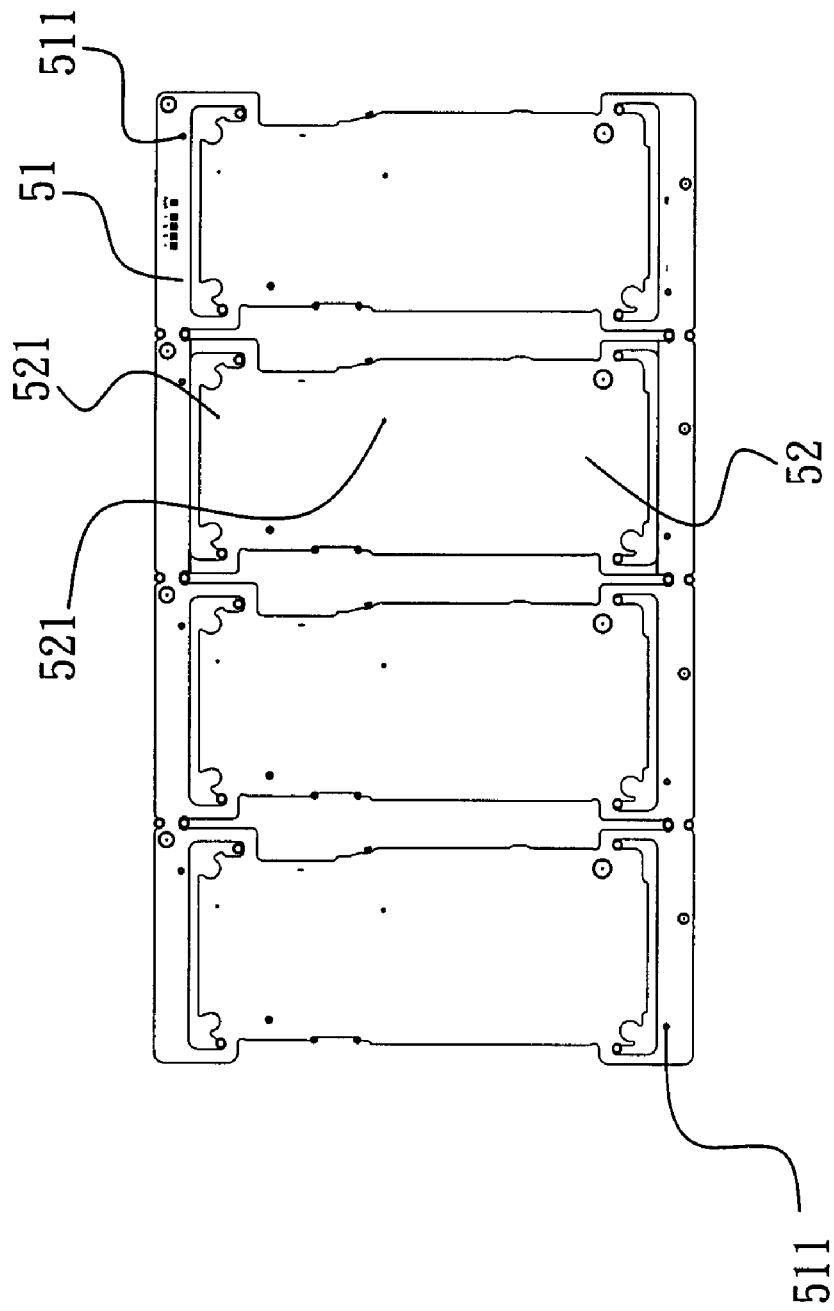
FIG. 5 is a schematic planar view showing the assembly between the daughter board and the main board of the circuit board that has defects in accordance with the present invention.

Referring to FIGS. 1 through 5, a method for positioning and assembling of a circuit board of the present invention comprises:

step one 61: capturing coordinate values of optical points 511 of a main board 51 and measuring points 521 of a daughter board 52 from a CAD/CAM diagram and storing the coordinate values in a controller 40;

step two 62: fixing at least two cameras 30 exactly above the optical points 511 of the main board 51 by adjustment according to the optical points 511 of the main board 51 of a practical circuit board;

step three 63: fixing at least two cameras 30 exactly above the measuring points 521 by adjustment according to the measuring points 521 of the daughter board 52 of the practical circuit board;

step four 64: calibrating the CAD/CAM diagram to obtain the error values between the coordinate values of the optical points 511 of the main board 51 and the measuring points 521 of the daughter board 52 and the practical circuit board so as to obtain the practical error values;

step five 65: inputting the error values into the controller 40 for calculation;

step six 66: inputting parameters and coordinate values required for adjustment;

step seven 67: adjusting the measuring points 521 of the daughter board 52 and the optical points 511 of the main board 51 that has defective pieces to obtain the required coordinate values and fixing them on the controller 40;

step eight 68: fixing front surfaces of the daughter board 52 and the main board 51 of the circuit board by an adhesive tape for completing the positioning operation after their measurements are completed;

step nine 69: spreading a layer of glue, such as epoxy adhesive, silica gel, and so forth, on the backside junctions of the daughter board 52 and the main board 51 of the circuit board;

step ten 70: baking and curing the daughter board 52 and the main board 51 of the circuit board that have the glue layer formed thereon; and step eleven 71: tearing off the adhesive tape disposed on the front surfaces of the daughter board 52 and the main board 51 of the circuit board so as to complete the positioning and assembling operation.

The main board 51 of the circuit board that has the defective pieces is fixed on a vacuum adsorption platform 11 of a vacuum adsorption mechanism 10 to lean against a positioning block 13 disposed on the vacuum adsorption platform 11 for adjusting the optical points 511 of the main board 51 to obtain the required coordinate values. The daughter board 52 of the circuit board is disposed correspondingly on an adjusting mechanism 20 located underneath the defective pieces of the main board 51 of the circuit board for adjusting the measuring points 521 of the daughter board 52 of the circuit board to obtain the required coordinate values. The adjusting mechanism 20 has a three-axis adjusting module and an adsorption platform 24. The three-axis adjusting module comprises a X-axis adjusting knob 21, a Y-axis adjusting knob 22, and a rotation-axis adjusting knob 23 so as to enable the adsorbed daughter board 52 of the circuit board to be adjustable in three axial directions. The three-axis adjusting module of the adjusting mechanism 20 is optionally an automatic adjusting module for X-axis, Y-axis and rotation-axis. In addition, the step one 61 through step six 66 can be repeated to perform the duplicate positioning and confirmation on the backside of the circuit board.

The apparatus for positioning and assembling the circuit board of the present invention comprises: a vacuum adsorption mechanism 10, an adjusting mechanism 20, at least four cameras 30, and a controller 40. The vacuum adsorption mechanism 10 has a vacuum adsorption platform 11 on which several holes 111 are formed. The vacuum adsorption platform 11 is connected to several vacuum generators 12. Each of these vacuum generators 12 is connected to a switch 121 so as to control the adsorption and positioning of the main board 51 of the circuit board. In addition, the vacuum adsorption platform 11 also has a through hole 112 formed thereon. The vacuum adsorption mechanism 10 has at least one L-shaped positioning block 13 to fit the outline of the main board 51 of the circuit board and to allow the main board 51 of the circuit board to lean against the positioning block 13.

The adjusting mechanism 20 is mounted on a position corresponding to the through hole 112 of the vacuum adsorption platform 11. The adjusting mechanism 20 has a three-axis adjusting module and an adsorption platform 24. The three-axis adjusting module comprises a X-axis adjusting knob 21, a Y-axis adjusting knob 22, and a rotation-axis adjusting knob 23 so as to enable the adsorbed daughter board 52 of the circuit board to be adjustable in three axial directions. The three-axis adjusting module of the adjusting mechanism 20 is optionally an automatic adjusting module for X-axis, Y-axis and rotation-axis.

Among these at least four cameras 30, two cameras 30 are located in positions corresponding to the main board 51 of the circuit board. The remaining two cameras 30 are located in positions corresponding to the daughter board 52 of the circuit board for detecting the optical points 511 of the main board 51 and the measuring points 521 of the daughter board 52.

The controller 40 is electrically connected to every camera 30 for purposes of detection, comparison, and positioning.

An apparatus and a method of operation thereof for positioning and assembling of the circuit board are composed by the above-mentioned components and steps. Referring to FIGS. 1 through 5 and according to the present invention, the coordinate values of the optical points 511 of the main board 51 and the measuring points 521 of the daughter board 52, which are captured from the CAD/CAM diagram, are stored in the controller 40 first, and at least two cameras are fixed respectively above the optical points 511 of the main board 51 and the measuring points 521 of the daughter board 52 by adjustment. Next, the main board 51 that, has the defective pieces is fixed on the vacuum adsorption platform 11 of the vacuum adsorption mechanism 10 to lean against the positioning block 13 disposed on the vacuum adsorption platform 11 for adjusting the optical points 511 of the main board 51 to obtain the required coordinate values. The daughter board 52 of the circuit board is disposed correspondingly on an adjusting mechanism 20 located underneath the defective pieces of the main board 51 of the circuit board for adjusting the measuring points 521 of the daughter board 52 of the circuit board by the X-axis adjusting knob 21, the Y-axis adjusting knob 22, and the rotation-axis adjusting knob 23 so as to enable the adsorbed daughter board 52 of the circuit board to be adjustable in three axial directions. In addition, the three-axis adjusting module of the adjusting mechanism 20 is optionally an automatic adjusting module for X-axis, Y-axis and rotation-axis. Next, the front surfaces of the daughter board 52 and the main board 51 of the circuit board are fixed by the adhesive tape for completing the positioning operation after their measurements are completed. Next, the glue layer is spread on the backside junctions of the daughter board 52 and the main board 51 of the circuit board. Next, the daughter board 52 and the main board 51 of the circuit board are baked and cured. Finally, the adhesive tape disposed on the front surfaces of the daughter board 52 and the main board 51 of the circuit board is torn off, and the positioning and assembling operation is thus completed. Accordingly, the present invention achieves the purposes of providing convenient, easy operation and convenient positioning so as to increase the practicability and convenience.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What the invention claimed is:

1. A method for positioning and assembling a circuit board, comprising:
    (a) capturing coordinate values of optical points of a main board and measuring points of a daughter board from a CAD/CAM diagram;
    (b) fixing at least two cameras exactly above said optical points of said main board by adjustment according to said optical points of said main board of a practical circuit board;
    (c) fixing at least two cameras exactly above said measuring points by adjustment according to said measuring points of said daughter board of said practical circuit board;
    (d) calibrating said CAD/CAM diagram to obtain error values between said coordinate values of said optical points of said main board and said measuring points of said daughter board and said practical circuit board so as to obtain practical error values;
    (e) inputting said error values into a controller for calculation;
    (f) inputting required parameters and coordinate values;
    (g) adjusting said measuring points of said daughter board and said optical points of said main board that has defective pieces to obtain said required coordinate values and fixing said daughter board and said main board on said controller;
    (h) fixing front surfaces of said daughter board and said main board of said circuit board by an adhesive tape for completing the positioning operation after their measurements are completed;
    (i) spreading a layer of glue on backside junctions of said daughter board and said main board of said circuit board;
    (j) baking and curing said daughter board and said main board of said circuit board that has said glue layer formed thereon; and
    (k) tearing off said adhesive tape disposed on said front surfaces of said daughter board and said main board of said circuit board so as to complete the positioning and assembling operation.

2. A method for positioning and assembling of a circuit board of claim 1, wherein said coordinate values of said optical points of said main board and said measuring points of said daughter board captured from said CAD/CAM diagram are stored in said controller.

3. A method for positioning and assembling a circuit board of claim 1, wherein said main board of said circuit board that has said defective pieces is fixed on a vacuum adsorption platform of a vacuum adsorption mechanism to lean against a positioning block disposed on said vacuum adsorption platform for adjusting said optical points of said main board to obtain said required coordinate values, and wherein said daughter board of said circuit board is disposed correspondingly on an adjusting mechanism located underneath said defective pieces of said main board of said circuit board for adjusting said measuring points of said daughter board of said circuit board to obtain said required coordinate values.

4. A method for positioning and assembling a circuit board of claim 3, wherein said adjusting mechanism comprises a X-axis adjusting knob, a Y-axis adjusting knob, a rotation-axis adjusting knob, and an adsorption platform so as to enable said daughter board of said circuit board to be adjustable in three axial directions.

5. A method for positioning and assembling a circuit board of claim 3, wherein said adjusting mechanism comprises an automatic adjusting module for X-axis, Y-axis and rotation-axis and an adsorption platform so as to enable said daughter board of said circuit board to be adjustable in three axial directions.

6. A method for positioning and assembling a circuit board of claim 1, wherein said (a) through (f) are repeated to perform the duplicate positioning and confirmation on the backside of said circuit board.

7. A method for positioning and assembling a circuit board of claim 1, wherein said glue is epoxy adhesive.

8. A method for positioning and assembling of a circuit board of claim 1, wherein said glue is silica gel.

* * * * *